United States Patent [19]

Stein

[11] 3,903,576

[45] Sept. 9, 1975

[54] APPARATUS FOR EXTRACTING CIRCUIT CARDS FROM CHASSIS

[75] Inventor: Seymour Stein, Monsey, N.Y.

[73] Assignee: The Bendix Corporation, Teterboro, N.J.

[22] Filed: Oct. 1, 1974

[21] Appl. No.: 510,934

[52] U.S. Cl. .......... 29/203 H; 29/200 D; 29/200 H; 29/203 HM; 29/278; 81/3 R; 294/15

[51] Int. Cl. .......... H01r

[58] Field of Search .......... 29/200 D, 200 H, 278, 29/203 H, 203 HM; 81/3 R, 3.8; 294/15

[56] References Cited

UNITED STATES PATENTS

| | | | |
|---|---|---|---|
| 1,563,000 | 11/1925 | Wajer et al. | 29/278 X |
| 2,821,777 | 2/1958 | Keister | 29/259 |
| 3,050,841 | 8/1962 | Esselstyn | 29/203 H |
| 3,457,621 | 7/1969 | Ebright et al. | 29/203 H |
| 3,484,129 | 12/1969 | Askren | 294/15 |
| 3,617,083 | 11/1971 | Koppensteiner | 29/278 X |
| 3,701,558 | 10/1972 | Baker | 294/15 X |
| 3,759,559 | 9/1973 | Yuska | 294/15 |

*Primary Examiner*—Richard J. Herbst
*Assistant Examiner*—Victor A. DiPalma
*Attorney, Agent, or Firm*—Anthony F. Cuoco; S. H. Hartz

[57] ABSTRACT

Apparatus for extracting circuit boards from chassis includes a pair of clamps having a variable center to center distance relative to holes carried in brackets secured to the circuit boards. The clamps are inserted in the holes and actuated against a corresponding pair of springs, whereby the spring force fixes the center to center distance while hooks on the clamps engage the circuit board brackets for operator removal of the boards from the chassis.

7 Claims, 3 Drawing Figures

APPARATUS FOR EXTRACTING CIRCUIT CARDS FROM CHASSIS

BACKGROUND OF THE INVENTION

1. Field of the Invention

This invention relates generally to apparatus for removing circuit boards from mating chassis and, more particularly, to apparatus for removing the circuit boards easily and without damage or mutilation.

2. Description of the Prior Art

When a circuit board is inserted in a chassis and engaged with a mating connector therein as in electronic "black boxes" such as used, for purposes of illustration, in aircraft control systems, a significant force is required to disconnect and remove the board from the chassis when repair and/or replacement is necessary. Extracting tools for exerting this force have heretofore required considerable manual skill and the chance of damaging or mutilating the board is ever present. Some circuit boards have been fabricated with handles attached thereto to facilitate removal, but boards of this type have generally been noisy during vibration conditions and the handles have been easily breakable. Other prior art devices for circuit board extractions have frequently resulted in bent connector pins and component damage upon dropping the extracted card after extraction. In this connection it is noted that an initial force is required to break the circuit board connector loose from the chassis mating connector and a somewhat lesser force is required to fully extract the board which may be supported in guides or channels. To accomplish the exertion of these two forces in a single manual operation without dropping and/or damaging the board is difficult with the prior art devices.

SUMMARY OF THE INVENTION

The present invention contemplates apparatus wherein a circuit board is extracted from a mating chassis after a positive engagement of the extractor and board has been achieved. The device of the invention includes a pair of clamps in variable spaced relation to each other for insertion in holes carried by a pair of brackets mounted to the circuit board. The clamps are actuated against a pair of springs which exert a force to fix the space between the clamps, whereby hooks carried by the clamps engage the plates after which the force or forces necessary to extract the circuit board from the chassis is applied as by pulling the board from the chassis. After the board has been extracted the clamps are actuated to release the spring force and to thereby release the clamp hooks from the circuit board brackets for easy and safe release of the board.

One object of this invention is to provide apparatus for removing chassis mounted circuit boards, and which apparatus may be used without any particular skill on the part of the operator.

Another object of this invention is to provide apparatus of the type described which prevents mutilation and/or dropping of the circuit boards upon extraction.

Another object of this invention is to provide apparatus of the type described which positively engages the circuit board for extraction, after which the circuit board is safely released to prevent dropping and/or mutilation.

Another object of this invention is to provide a circuit board extractor which enables an operator to safely exert an initial force to disconnect the board from the chassis and then to exert a lesser force to extract the card from the chassis while eliminating the chance of damaging the board or its associated components.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 3:
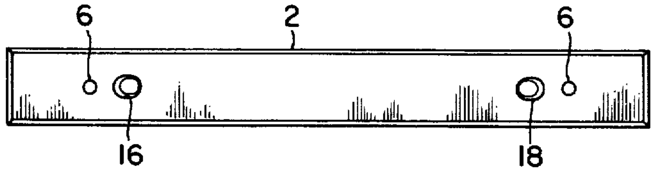
FIG. 3 is a bottom view of the device of the invention.

With reference to the drawing, the invention includes a base 2 which may be of a laminated phenolic or some other such suitable material to prevent marring of a circuit board 3 and chassis (not shown) when the base is in contact therewith. A handle 4 which may be of a suitable metallic material is secured to base 2 through screws 6 or the like. Base 2 includes steps 2A at either end thereof which align the device with the chassis. A pair of clamps 8 and 10, which are generally right angular in shape, are arranged to fit within grooves 12 and 14, respectively, of handle 4. Clamp 8 includes a portion 8A shown extending vertically in FIG. 1 through a clearance hole 16 and a clamp 19 includes a portion 10A shown extending vertically through a clearance hole 18. Holes 16 and 18, best shown in FIG. 3, are elongated to provide a variable center to center distance between clamp portions 8A and 10A when the clamp portions are free of the force of springs 30 and 34 (FIG. 1) as will be hereinafter more fully described.

Figure 2:
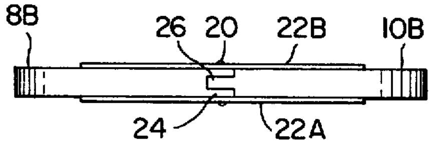
FIG. 2 is a top view of a clamping arrangement according to the invention.
Figure 1:
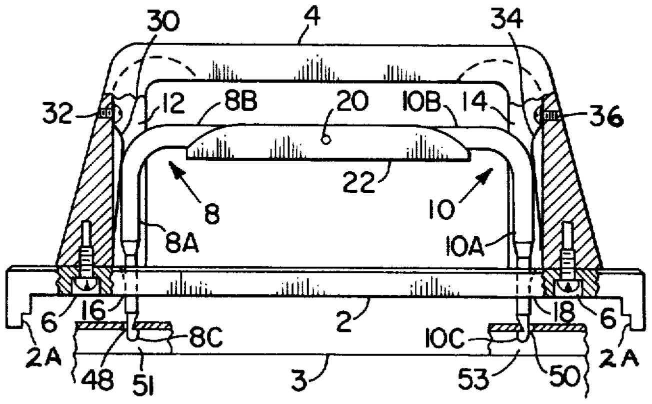
FIG. 1 is a partially sectioned diagrammatic side view showing the device of the invention in conjunction with a circuit board, and which board is to be extracted by said device from a chassis.

Clamps 8 and 10 have portions 8B and 10B showing extending horizontally in FIG. 1, and assembled in a tongue and groove arrangement as best shown in FIG. 2. Portions 8B and 10B are pinned together by, for example, a slotted roll pin 20 extending through a shield 22 supporting the clamps. Thus, clamp portion 8B includes a groove 24 (FIG. 2) which receives a corresponding tongue 26 of clamp portion 10B. With the tongue and groove so engaged, the clamps are carried within shield 22, which may be a channel shape member, whereupon pin 20 is forced through a hole in side 22A of shield 22, through clamp portions 8B and 10B including groove 24 and tongue 26, respectively, and through the other side 22B of shield 22 to secure the shield and clamps together more or less loosely.

Spring 30, which may be a leaf spring or the like, is secured by a screw 32 within channel 12 of handle 4, and like spring 34 is secured by a screw 36 in channel 14 of handle 4. With clamps 8 and 10 and shield 22 displaced away from handle 4 as shown in FIG. 1 and assembled through pin 20 as heretofore noted, and with holes 16 and 18 elongated as shown in FIG. 3, the clamps are free to float laterally since springs 30 and 34 do not exert a force on the clamps. Longitudinal movement of the clamps toward handle 4 as by squeezing shield 22 causes the springs to exert a force on the clamps whereupon the center to center distance between clamp portions 8A and 10A becomes fixed for positive engagement of circuit board 3 and extraction thereof from the chassis (not shown) as will next be described.

OPERATION OF THE INVENTION

In using the invention, clamp portions 8A and 10A are aligned with holes 48 and 50, respectively, which may be carried by brackets 51 and 53 suitably mounted on circuit board 3, and which brackets may be used for purposes other than the invention such as for mounting or the like. In this connection it is noted that clamp portions 8A and 10A have hooked ends 8C and 10c, respectively. The hooked ends engage the undersides of brackets 51 and 53 near holes 48 and 50 upon insertion of the ends in the holes and actuation of shield 22 toward handle 4 as by squeezing so that springs 30 and 34 exert a force against the clamps to positively grasp circuit board 3, whereupon an operator force or forces may be exerted for disengaging the board from the chassis connectors and extraction of the board from the chassis. Upon extraction, the board is released by moving bracket 22 in the opposite direction as by pushing, whereby hooks 8C and 10C become disengaged from brackets 51 and 53 for removal of board 3 from the extracting apparatus of the invention.

It will now be seen from the aforenoted description of the invention that a circuit board extractor which is easy to use and provides a positive means of extraction of the boards from a chassis has been provided. The danger of dropping the board upon extraction due to the somewhat greater initial disengaging force as compared to the final force for extraction has been eliminated. Moreover, mutilation of the board upon extraction is eliminated. Since clamps 8 and 10 are initially allowed to float, the tolerances of holes 48 and 50 on circuit board brackets 51 and 53 need not be closely held. Further, it will be understood that slight modifications in the apparatus described will enable it to be used with circuit boards or various sizes and configurations.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A device for disengaging and removing a circuit board from a chassis, the circuit board being supported in the chassis and engaged with mating connectors therein, the device comprising:

clamping means including a pair of clamps supported in variable spaced relation to each other and relative to receiving holes carried by a pair of brackets supported by the circuit board;

each of the clamps including an end received by the hole in the corresponding circuit board bracket;

a pair of resilient members, each of which is supported adjacent a corresponding one of said clamps, for exerting a force on the clamps to fix the space therebetween when the clamping means is actuated away from the circuit board against the resilient members;

the clamp ends being arranged to grasp the area around the underside of the receiving holes upon the space between the clamps being fixed;

means arranged with the clamping means and resilient means for enabling an operator to exert a force for first disengaging the circuit board from the chassis connectors and then removing the board from the chassis; and the clamp ends being released from the underside of the receiving holes upon actuation of the clamping means toward the circuit board after the board has been removed from the chassis to release the force exerted on the clamps by the resilient members and to release the board.

2. A device as described by claim 1, including:

a base having means for aligning the base with the chassis;

elongated holes carried by the base, the ends of the variable spaced clamps extending through the elongated holes in the base and being received by the bracket holes;

a handle supported by the base and spanning the clamping means; and the clamping means being actuated away from the circuit board toward the handle whereupon the resilient members exert a force on the clamps to fix the space therebetween.

3. A device as described by claim 2, wherein:

the clamps included in the clamping means each have first and second members at substantially right angles to each other; and the handle spanning the clamping means includes channels at opposite ends thereof, the channel at one end supporting one of the resilient members and receiving one of the first and second members of one of the clamps adjacent its associated resilient member, and the channel at the opposite end supporting the other of the resilient members and receiving one of the first and second members of the other of the clamps adjacent its associated resilient member.

4. A device as described by claim 3, wherein the clamping means further includes:

a channel member for supporting the other of the first and second right angle clamp members of each of the clamps.

5. A device as described by claim 4, wherein:

the right angle clamp members supported by the channel are engaged in tongue and groove arrangement; and a pin extends through the channel and the right angle clamp members for loosely securing said right angle and channel members together.

6. A device as described by claim 1, wherein:

the clamp ends are hooked to grasp the area around the underside of the receiving holes upon the space between the clamps being fixed.

7. A device as described by claim 1, wherein the means arranged with the clamping means and the resilient means for enabling an operator to exert a force for first disengaging the circuit board from the chassis connectors and then removing the board from the chassis includes:

a handle spanning the clamping means and supporting the resilient means, and graspable by the operator with the clamping means for exerting said force.

* * * * *